US009297862B2

(12) United States Patent
Oughton, Jr. et al.

(10) Patent No.: US 9,297,862 B2
(45) Date of Patent: Mar. 29, 2016

(54) SYSTEMS AND APPARATUS FOR FAULT DETECTION IN DC POWER SOURCES USING AC RESIDUAL CURRENT DETECTION

(75) Inventors: George W. Oughton, Jr., Raleigh, NC (US); Yu Liu, Milwaukee, WI (US); Debrup Das, Atlanta, GA (US); Pasi S. Taimela, Wake Forest, NC (US); Bobby L. Compton, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 1042 days.

(21) Appl. No.: 13/193,026

(22) Filed: Jul. 28, 2011

(65) Prior Publication Data

US 2013/0027077 A1  Jan. 31, 2013

(51) Int. Cl.
*G01R 31/40* (2014.01)
*G01R 31/02* (2006.01)

(52) U.S. Cl.
CPC .............. *G01R 31/40* (2013.01); *G01R 31/025* (2013.01)

(58) Field of Classification Search
None
See application file for complete search history.

(56) References Cited

U.S. PATENT DOCUMENTS

| | | | |
|---|---|---|---|
| 4,188,574 A | 2/1980 | Allington | |
| 5,426,553 A * | 6/1995 | Kim | 361/44 |
| 6,218,744 B1 * | 4/2001 | Zahrte, Sr. | G05F 1/14 307/64 |
| 6,320,769 B2 | 11/2001 | Kurokami et al. | |
| 6,593,520 B2 | 7/2003 | Kondo et al. | |
| 6,856,497 B2 | 2/2005 | Suzui et al. | |
| 6,930,868 B2 | 8/2005 | Kondo et al. | |
| 7,005,883 B2 | 2/2006 | Liao et al. | |
| 7,079,406 B2 | 7/2006 | Kurokami et al. | |
| 7,088,601 B2 * | 8/2006 | Tracy | H02J 9/062 307/66 |
| 7,508,094 B2 * | 3/2009 | Johnson, Jr. | H02J 9/062 307/64 |
| 2007/0216228 A1 * | 9/2007 | Johnson, Jr. | H02J 9/062 307/64 |
| 2008/0147335 A1 * | 6/2008 | Adest et al. | 702/64 |
| 2008/0239775 A1 * | 10/2008 | Oughton et al. | 363/134 |

(Continued)

FOREIGN PATENT DOCUMENTS

| | | | |
|---|---|---|---|
| CA | 2741425 A1 * | 5/2010 | |
| CN | 101 387 682 A | 3/2009 | |
| WO | WO 95/34824 A1 | 12/1995 | |

OTHER PUBLICATIONS

Chemmangot V. Nayar et al. "A Grid-Interactive Photovoltaic Uninterruptible Power Supply System Using Battery Storage and a Back Up Diesel Generator", Sep. 2000, IEEE Trans. on Energy Conversion, V. 15, No. 3, pp. 348-353.*

(Continued)

*Primary Examiner* — Jermele M Hollington
(74) *Attorney, Agent, or Firm* — Myers Bigel & Sibley, P.A.

(57) ABSTRACT

A fault in a DC power source, such as a battery string or a string of photovoltaic cells, is identified by detecting a change in an AC component of a residual current of the DC power source. In some embodiments, the DC power source is coupled to at least one DC bus and the methods further include generating an AC voltage on the at least one DC bus. For example, the DC power source may be coupled to a modulated DC bus of an uninterruptible power supply (UPS) system comprising an inverter having an input coupled to the DC bus. The inverter may be configured to generate an AC output voltage and the AC component has a frequency that is a harmonic of a fundamental frequency of the AC output voltage, such as a third harmonic of the fundamental frequency of the AC output voltage.

19 Claims, 15 Drawing Sheets

(56) References Cited

U.S. PATENT DOCUMENTS

2009/0179655 A1    7/2009    Trenchs Magana et al.
2015/0171663 A1*  6/2015    Krstic .................... H02M 1/12
                                                                307/23

OTHER PUBLICATIONS

International Search Report Corresponding to International Application No. PCT/US2012/047671; Date of Mailing: Nov. 5, 2012; 12 Pages.

ABB Power T&D Company Inc., "Circuit Shield Type 27G, 180Hz Third Harmonic Undervoltage Relay", *Descriptive Bulletin 41-726S*, Oct. 1993, 3 pages.

Circutor, RGU-10 / RGU-10C Electronic earth leakage protection relay, User Manual, http://www.circutor.com, 32 pages, 2010.

Doepke-Info, "Type B AC-DC Sensitive Residual Current Protective Devices", Regulations and Recommendations, www.doepke.de, 2 pages, 2010.

F200 Series Residual Current Devices, ABB Residual Current Devices, F200 Series UL 1053, Low Voltage Products & Systems, www.abb-conrol.com, 8 pages, 2010.

Protecting and Disconnecting in Photovoltaic Systems, Product Information, AC/DC switching and protection devices, Photovoltaic switchgear. From small houses to large-scale systems, www.eaton.com, www.moeller.net, 12 pages, 2008.

Protective Measures with Prewarning Function, Selection Guide, PFR Residual Current Relay with Ring-Type Transducer, vvww.moeller.net, 6 pages, 2004.

Residual current protection without unwanted tripping AP range of RCCB and RCD blocks, www.abb.com, 6 pages, 2010.

Residual Current Protective Devices, BETA Low-Voltage Circuit Protection Technology Primer, www.siemens.com/beta, 71 pages, 2010.

* cited by examiner

SYSTEMS AND APPARATUS FOR FAULT DETECTION IN DC POWER SOURCES USING AC RESIDUAL CURRENT DETECTION

BACKGROUND

The inventive subject matter relates to power systems and methods and, more particularly, to fault detection in power systems using DC power sources.

Power conversion systems that are used to serve AC loads often include an inverter that generates an AC output from a DC voltage provided by a power source. For example, uninterruptible power supply (UPS) systems, which are used to provide uninterrupted power in critical applications, commonly use a battery or other DC power source to provide backup power to an inverter in the event of the failure of a primary power source, such as an AC utility source. Converters used to interface photovoltaic panels to AC power distribution systems also commonly include an inverter that operates off of DC power provided by the photovoltaic panels. Some UPS systems may also be designed to provide power to AC loads from photovoltaic panels, as described, for example, in U.S. patent application Ser. No. 12/779,522, filed May 13, 2010.

In many such applications, the DC power source may be operated such that it "floats" with respect to a system ground. However, ground faults may occur in such systems due to environmental contamination, electrolyte leakage, impact damage and/or other events. Such ground faults may pose operational and safety problems. Techniques for detecting and dealing with ground faults in battery and photovoltaic systems are described, for example, in U.S. Pat. No. 6,593,520, U.S. Pat. No. 6,320,769, U.S. Pat. No. 7,079,406, U.S. Pat. No. 6,856,497, U.S. Pat. No. 7,005,883 and U.S. Pat. No. 6,930,868.

SUMMARY

Some embodiments of the inventive subject matter provide methods of monitoring a DC power source, such as a string of electrochemical or photovoltaic cells. A fault in the DC power source is identified by detecting a change in an AC component of a residual current of the DC power source. In some embodiments, the DC power source is coupled to at least one DC bus and the methods further include generating an AC voltage on the at least one DC bus. For example, the DC power source may be coupled to a DC bus of an uninterruptible power supply (UPS) system comprising an inverter having an input coupled to the DC bus and the methods may include generating a voltage having an AC component on the DC bus of the UPS system. In some embodiments, the UPS system comprises first and second DC busses and a neutral and generating a voltage having an AC component on the DC bus of the UPS system comprises shifting the first and second DC busses with respect to the neutral. The inverter may be configured to generate an AC output voltage and the AC component has a frequency that is a harmonic (e.g., a third harmonic) of a fundamental frequency of the AC output voltage.

In further embodiments, identifying a fault in the DC power source by detecting a change in an AC component of a residual current of the DC power source may include identifying a first fault in the DC power source by detecting a change in the AC component of a residual current of the DC power source. The methods may further include identifying a second fault in the DC power source by detecting a change in an amplitude of the residual current of the DC power source. Identifying a second fault in the DC power source by detecting a change in an amplitude of the residual current of the DC power source may include detecting a change in RMS or peak value of the residual current.

Further embodiments of the inventive subject matter provide a system for monitoring a DC power source. The system includes a current sensor configured to detect a residual current of the DC power source and a fault detection circuit coupled to the current sensor and configured to detect a change in an AC component of the residual current of the DC power source and to identify a fault in the DC power source responsive thereto. The DC power source may be coupled to at least one DC bus and the system may further include means for generating an AC voltage on the at least one DC bus.

Further embodiments provide a UPS system including a DC bus, a DC bus modulation circuit configured to generate an AC component on the DC bus and an inverter having an input coupled to the DC bus and configured to generate an AC output voltage therefrom. The system further includes a DC power source coupled to the DC bus, a current sensor configured to detect a residual current of the DC power source and a fault detection circuit coupled to the current sensor and configured to detect a change in an AC component of the residual current of the DC power source and to identify a fault in the DC power source responsive thereto. The DC bus may include first and second DC busses and the DC bus modulation circuit may be configured to shift the first and second DC busses with respect to a neutral. The DC bus modulation circuit may include a neutral coupling circuit configured to selectively couple the first and second DC busses to the neutral.

DETAILED DESCRIPTION OF EMBODIMENTS

Figure 1:
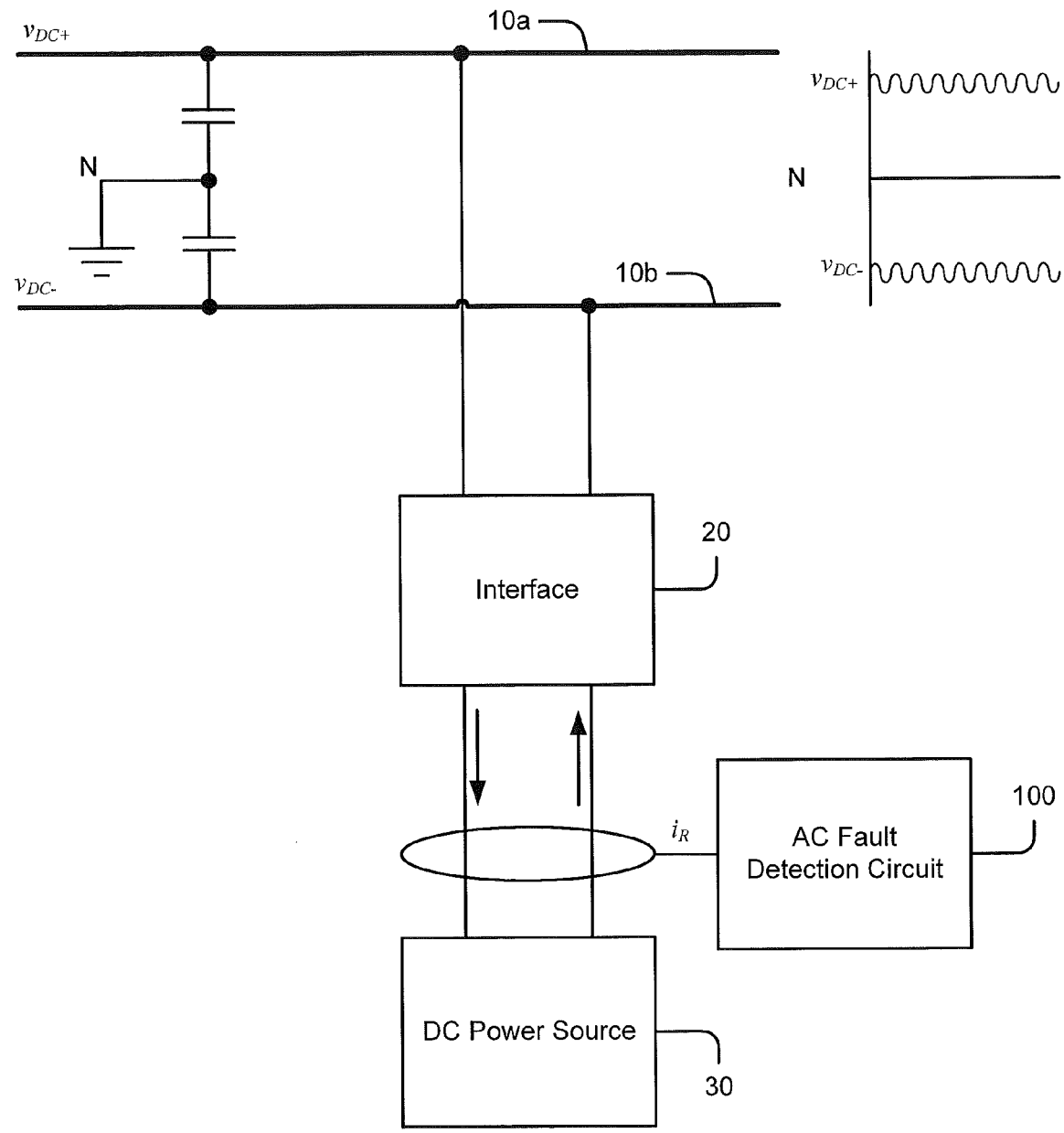
FIGS. 1 and 2 are schematic diagrams illustrating apparatus and methods for fault identification in power apparatus including a DC power source according to some embodiments of the inventive subject matter.

Specific embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

As will be appreciated by one of skill in the art, the inventive subject matter may be embodied as systems and methods. Some embodiments of the inventive subject matter may include hardware and/or combinations of hardware and software. Some embodiments of the inventive subject matter include circuitry configured to provide functions described herein. It will be appreciated that such circuitry may include analog circuits, digital circuits, and combinations of analog and digital circuits.

Embodiments of the inventive subject matter are described below with reference to diagrams of systems and methods according to various embodiments of the inventive subject matter. It will be understood that each block of the diagrams, and combinations of blocks in the diagrams, can be implemented by analog and/or digital hardware, and/or computer program instructions. These computer program instructions may be provided to a processor of a general purpose computer, special purpose computer, ASIC, and/or other programmable data processing apparatus, such that the instructions, which execute via the processor of the computer and/or other programmable data processing apparatus, create means for implementing the functions/acts specified in the diagrams.

FIG. 1 illustrates apparatus and methods according to some embodiments of the inventive subject matter. First and second DC busses 10a, 10b are at respective first and second voltages $v_{DC+}$ and $v_{DC-}$ with respect to a neutral node N, which, in the illustrated embodiments, is connected to ground. Each of the bus voltages $v_{DC+}$ and $v_{DC-}$ includes an AC component with respect to the neutral node N. The AC component may be generated in a number of different ways, as explained in greater detail below. An interface circuit 20 interfaces a DC power source 30 to the DC busses 10a, 10b. The DC power source 30 may include, for example, one or more strings of serially-connected electrochemical battery cells or one or more strings of serially-connected photovoltaic cells (e.g., solar panels). The interface circuit 20 may include, for example, an intervening conversion circuit (e.g., a DC/DC converter) or direct connection between the DC power source 30 and the DC busses 10a, 10b.

As further illustrated, an AC fault identification circuit 100 is configured to sense a residual (i.e., net) current $i_R$ of the DC power source 30 and to detect a fault of the DC power source 30 responsive to an AC component of the detected residual current $i_R$. For example, in embodiments described below, the AC fault detection circuit 30 may be configured to detect an AC current component having a frequency associated with a harmonic of an AC voltage generated by an inverter coupled to the DC busses 10a, 10b. Such detection information may be used, for example, to discriminate between low and high impedance faults, and to take corresponding action based on the nature of the fault detected.

Figure 2:
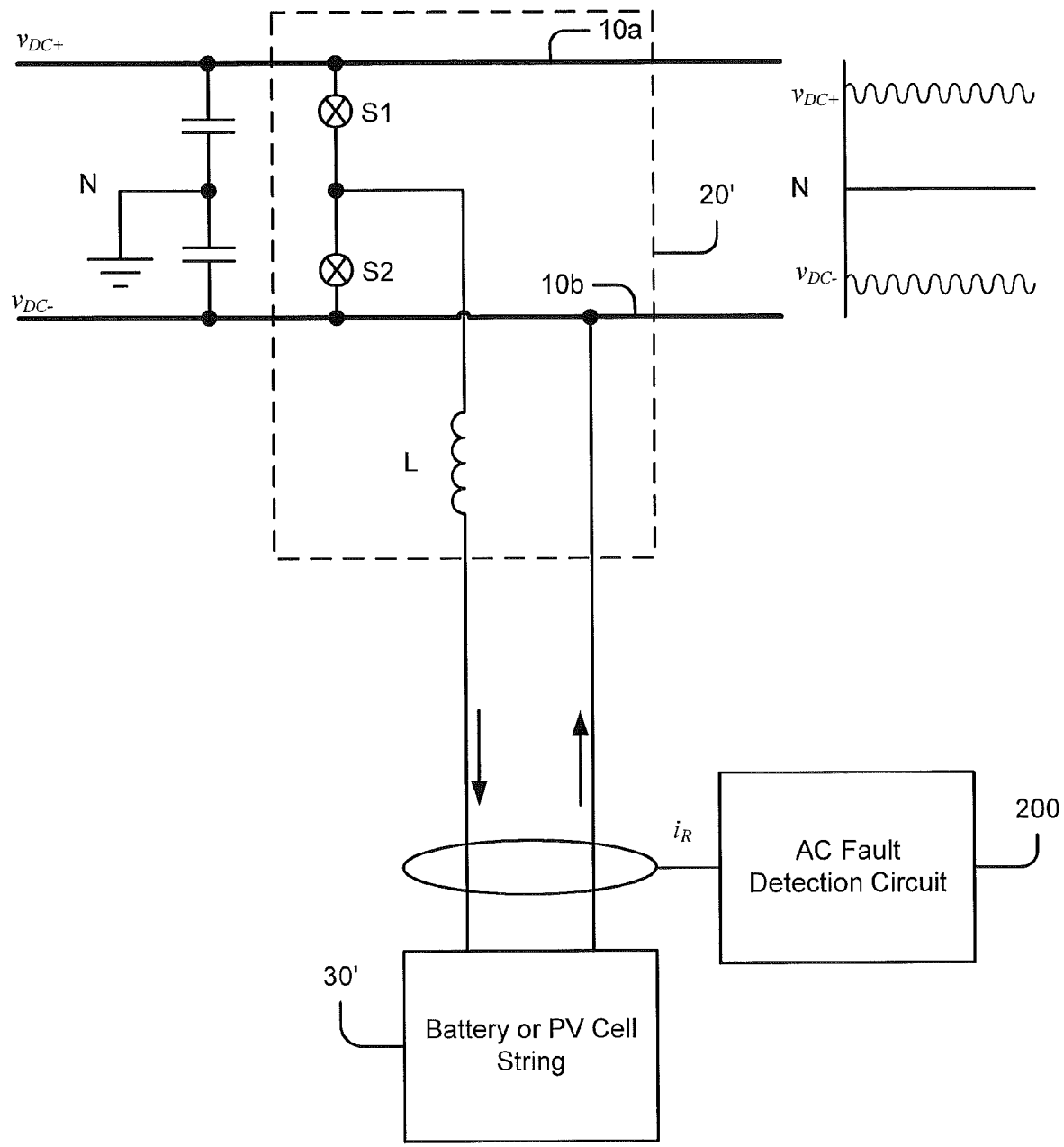

FIG. 2 illustrates an example application of the inventive subject matter. A DC source, in the form of an electrochemical battery cell or photovoltaic cell string 30', is interfaced to DC busses 10a, 10b using a half-bridge converter circuit 20'. The converter circuit 20' includes first and second switches S1, S2 (e.g., transistors) that selectively couple the string 30' to the DC busses 10a, 10b via an inductor L. An AC fault detection circuit 200 is configured to sense a residual current $i_R$ of the cell string 30' and to detect a fault in the string 30' responsive to an AC component of the sensed residual current $i_R$.

Figure 3:
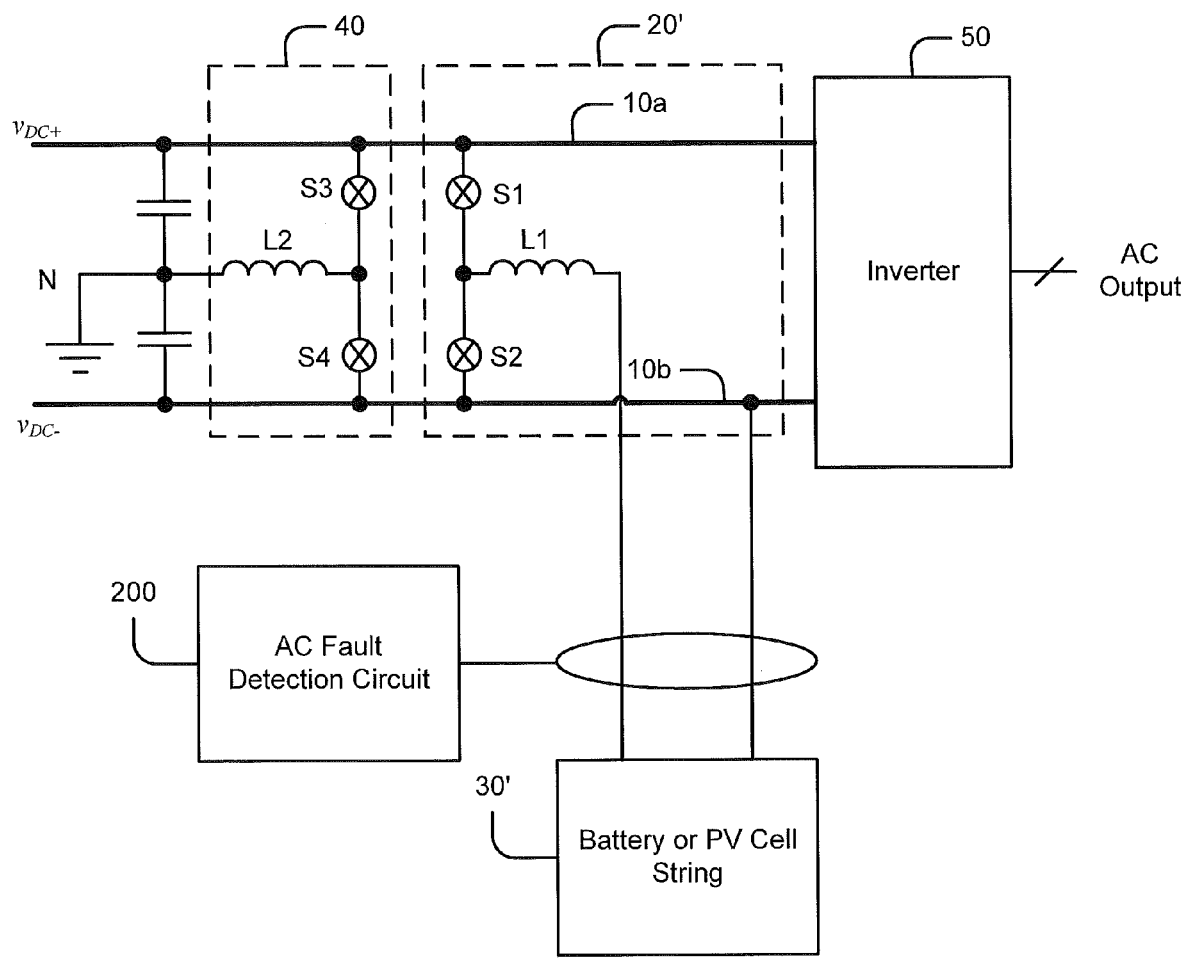
FIG. 3 is a schematic diagram illustrating apparatus and methods for fault identification in a DC power source interfaced with an inverter according to some embodiments of the inventive subject matter.

FIG. 3 illustrates implementation of such an arrangement in a power conversion system including an inverter 50 that is configured to generate an AC output from power delivered from DC busses 10a, 10b. The system of FIG. 3 includes a half-bridge converter circuit 20' including switches S1, S2 and an inductor L1 configured to interface a battery or photovoltaic cell string 30' to the DC busses 10a, 10b along the lines discussed above. The system further includes a neutral coupling circuit 40, including switches S3, S4 that are configured to selectively couple the DC busses 10a, 10b to a neutral node N via an inductor L2. The neutral coupling circuit 40 may be used to generate an AC component in the DC bus voltages $v_{DC+}$ and $v_{DC-}$.

As explained, for example, in U.S. Pat. No. 7,088,601 to Tracy et al., the disclosure of which is incorporated herein by reference in its entirety, such a neutral coupling circuit may be used to modulate or shift the DC busses 10a, 10b with respect to the neutral N to create an AC voltage component in the DC bus voltages $v_{DC+}$ and $v_{DC-}$. In three-phase UPS applications, this AC component may have a frequency that is a third harmonic of the fundamental frequency (e.g., 60 Hz) of the AC output produced by the inverter of the UPS. It will be understood that this technique represents one way of producing an AC component in the residual current $i_R$ for purposes of fault detection, but other techniques may be used within the scope of the inventive subject matter.

Figure 4:
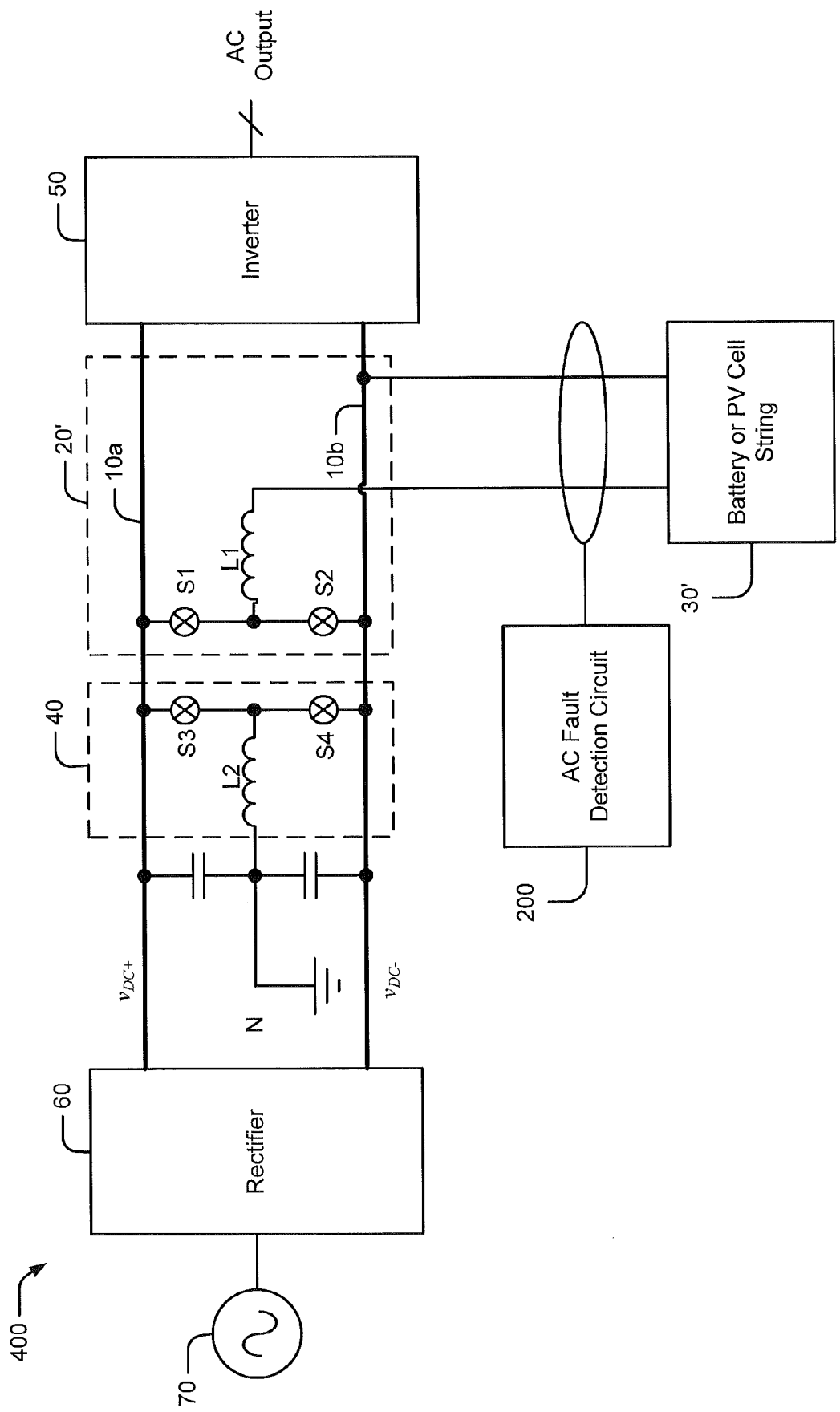
FIG. 4 is a schematic diagram illustrating apparatus and methods for fault identification in a DC power source interfaced with an UPS with DC bus modulation according to some embodiments of the inventive subject matter.

FIG. 4 illustrates a UPS system 400 according to further embodiments. The UPS system 400 including a rectifier circuit 60 that is configured to be coupled to an AC source 70 (e.g., a three-phase AC utility source) and to generate first and second DC voltages $v_{DC+}$ and $v_{DC-}$ on first and second DC busses 10a, 10b. The system 400 also includes a neutral coupling circuit 40 that is configured to modulate the DC bus voltages $v_{DC+}$ and $v_{DC-}$ with respect to a neutral N, which is shown as grounded. The system 400 further includes an output inverter 50 coupled to the DC busses 10a, 10b and configured to generate an AC output, and a converter circuit 20' that interfaces a DC power source, e.g., a battery or photovoltaic cell string 30', to the DC busses 10a, 10b. An AC fault detection circuit 200 is configure to detect faults in the battery or photovoltaic cell string 30' responsive to an AC component of a residual current of the battery or photovoltaic cell string using, for example, techniques described above. It will be appreciated that the AC fault detection circuit 200 may be a standalone device (or combination of devices) or may be integrated with the battery or photovoltaic cell string 30' or with the UPS system 400.

Figure 5:
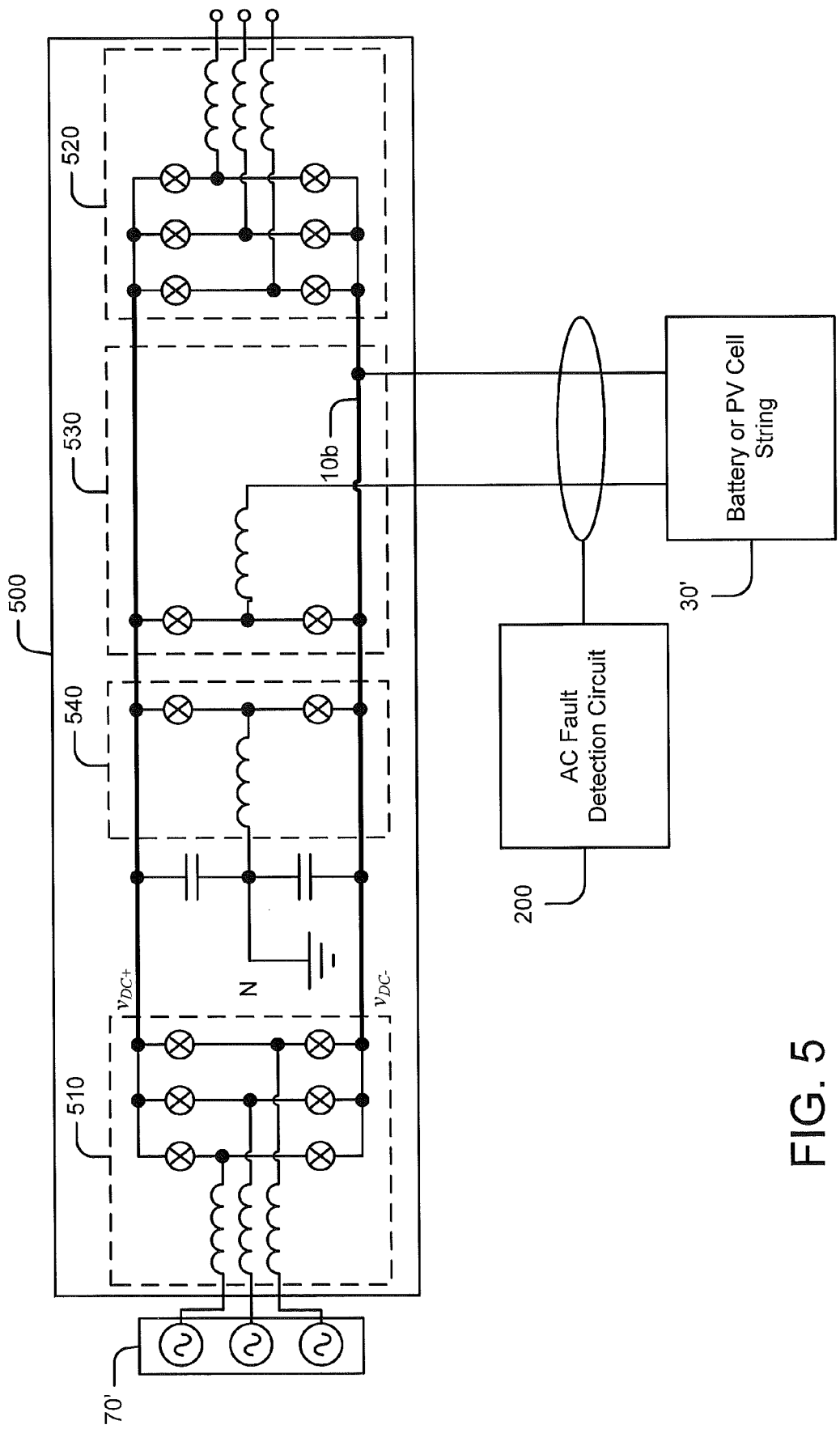
FIG. 5 is a schematic diagram illustrating apparatus and methods for fault identification in a DC power source interfaced with a UPS module with DC bus modulation according to some embodiments of the inventive subject matter.

Some UPS systems employ a scalable modular architecture using UPS modules that provide functionality along the lines of the system 400 of FIG. 4 and that are coupled in parallel to provide power to a load. FIG. 5 illustrates an example of such a UPS module 500, including a rectifier circuit 510, an inverter circuit 520 and a neutral coupling circuit 540. A DC/DC converter circuit 530 is used to interface a battery or photovoltaic cell string 30' to the module 500. Faults in the battery or photovoltaic cell string 30' may be detected by an AC fault detection circuit 200 along the lines described above. It will be appreciated that the AC fault detection circuit 200 may be a standalone device (or combination of devices) or may be integrated with the battery or photovoltaic cell string 30' or with the UPS module 500.

Figure 6:
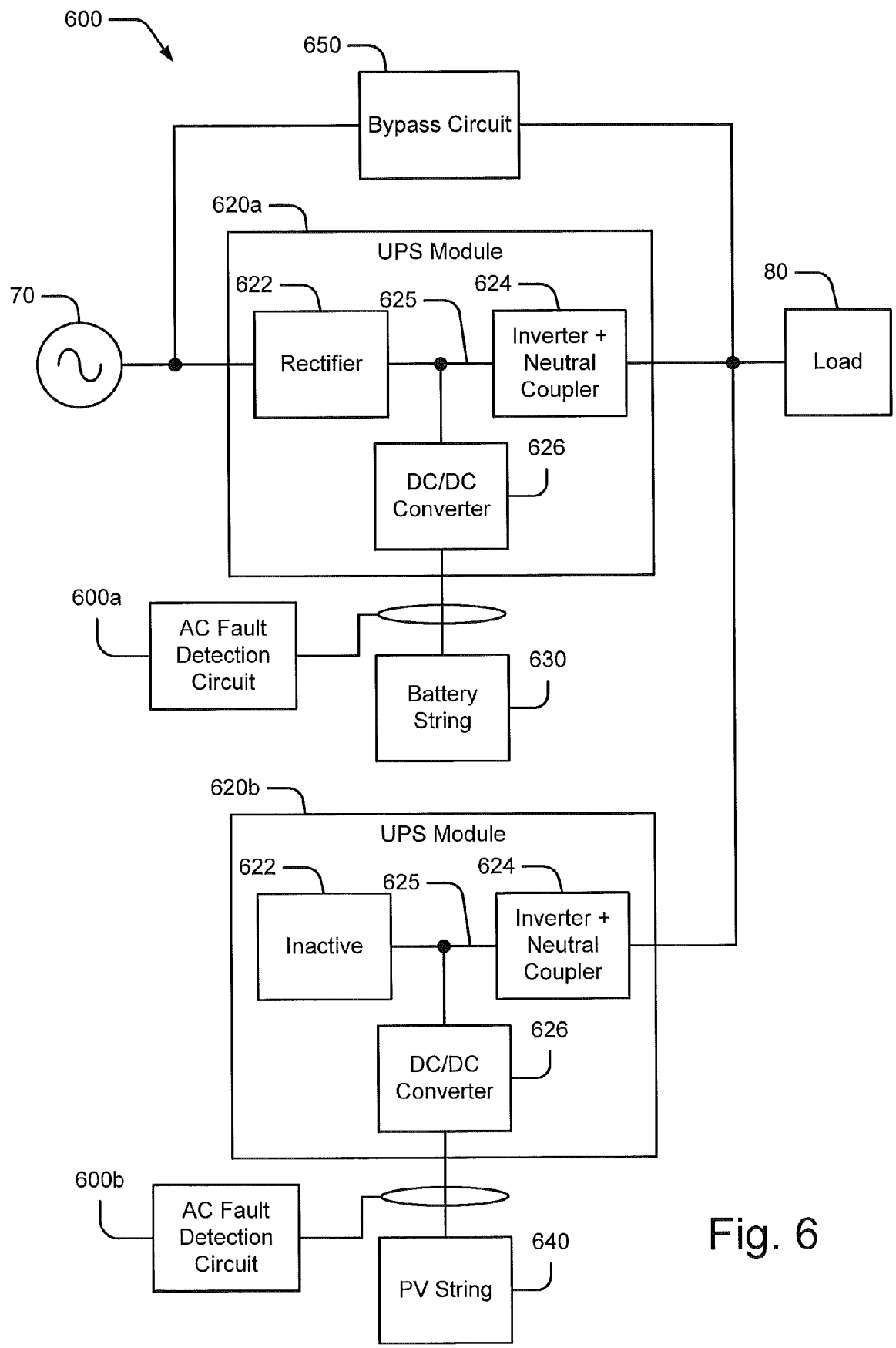
FIG. 6 is a schematic diagram illustrating apparatus and methods for fault identification in battery and photovoltaic sources interfaced with a multi-module UPS according to some embodiments of the inventive subject matter.

FIG. 6 illustrates an example of a fault detection solution for a modular UPS system 600 that is configured to interface to both battery and photovoltaic power sources. First and second UPS modules 620a, 620b are coupled in parallel to a load 80. Each of the UPS modules 620a, 620b includes converter circuits 622, 624, 626 coupled to a DC bus 625. In the first module 620a, a first converter circuit 622 is configured to operate as a rectifier, coupled to an AC source 70. A second converter circuit 624 is configured to provide neutral coupling and inverter operations. A third converter circuit 626 is configured as a DC/DC converter that interfaces a battery string 630 to the DC bus 625.

In the second module 620b, a first converter circuit 622 is inactive while a second converter 624 provides inverter and neutral coupling functions and a third converter circuit 626 acts as a DC/DC converter interface for a photovoltaic string 640. Respective fault AC fault detection circuits 600a, 600b are provided for the battery string 630 and the photovoltaic string 640. It will be appreciated that the AC fault detection circuits 600a, 600b may operate along the lines described above, and that the AC fault detection circuits 600a, 600b may be standalone devices or may be integrated with each other and/or with the UPS modules 620a, 620b.

Figure 7:
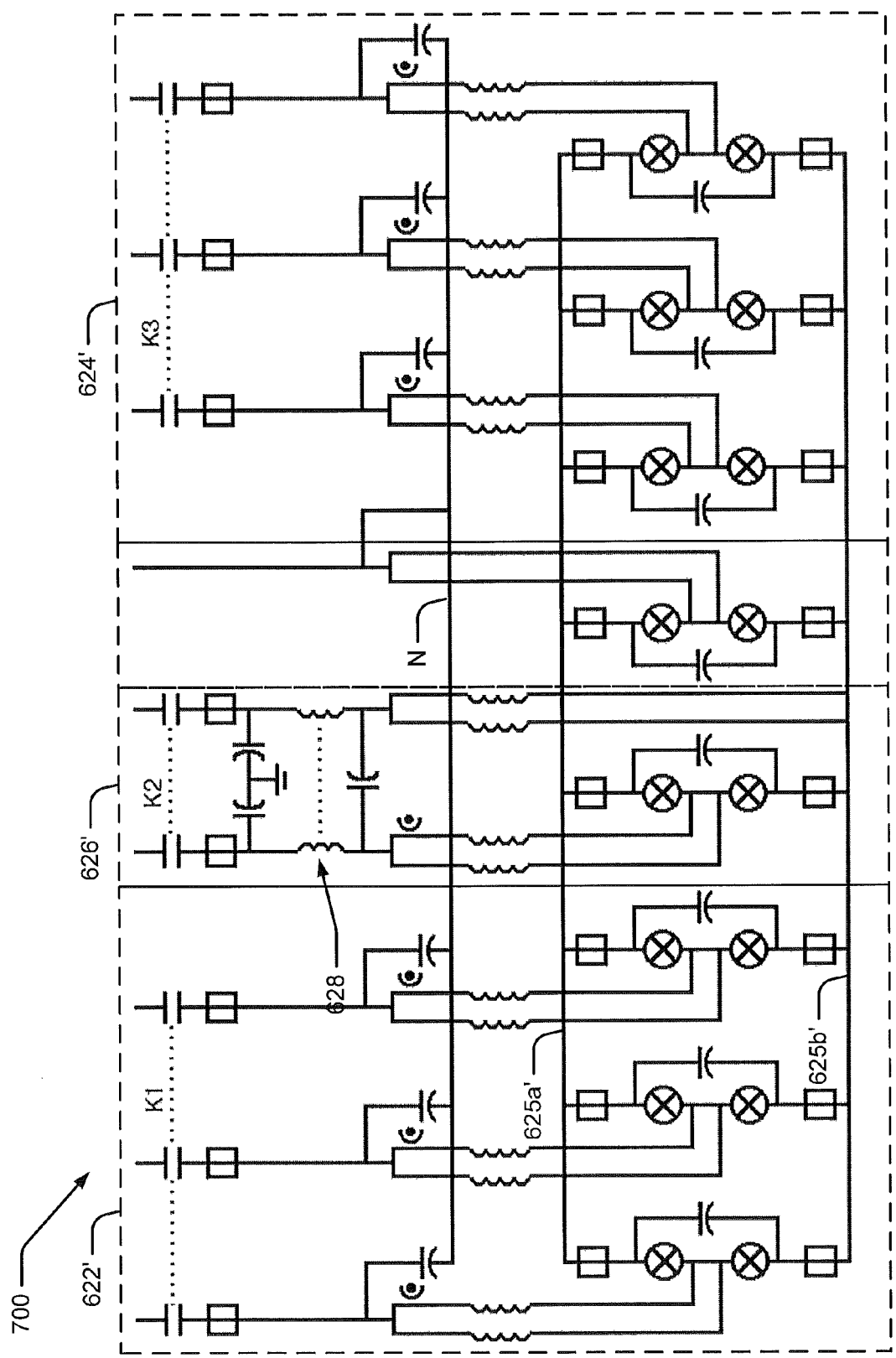
FIG. 7 a schematic diagram illustrating a UPS module for use in the apparatus of FIG. 6.

FIG. 7 illustrates an example of a UPS module 700 utilized in the Eaton 9395 UPS, which may be utilized in a configuration along the lines illustrated in FIG. 6. The module 700 includes converter circuits 622', 624' and 626' that are configured to be coupled to an AC source, an AC load and a DC source, respectively, via respective contactors K1, K3, K2. The converter circuits 622', 624', 626' are interconnected by DC busses 625a, 625b and a neutral bus N. As illustrated, the converter circuit 626', which may be used to interface, for example, a battery or photovoltaic cell string, includes a common mode filter circuit 628, which is designed to filter out high-frequency noise generated by the converters 622,' 624', 626'. As this common mode filter 628 is designed to filter higher-frequency noise, it may not interfere with detection of lower-frequency AC harmonic currents that are used in AC fault detection techniques described herein.

Figure 8:
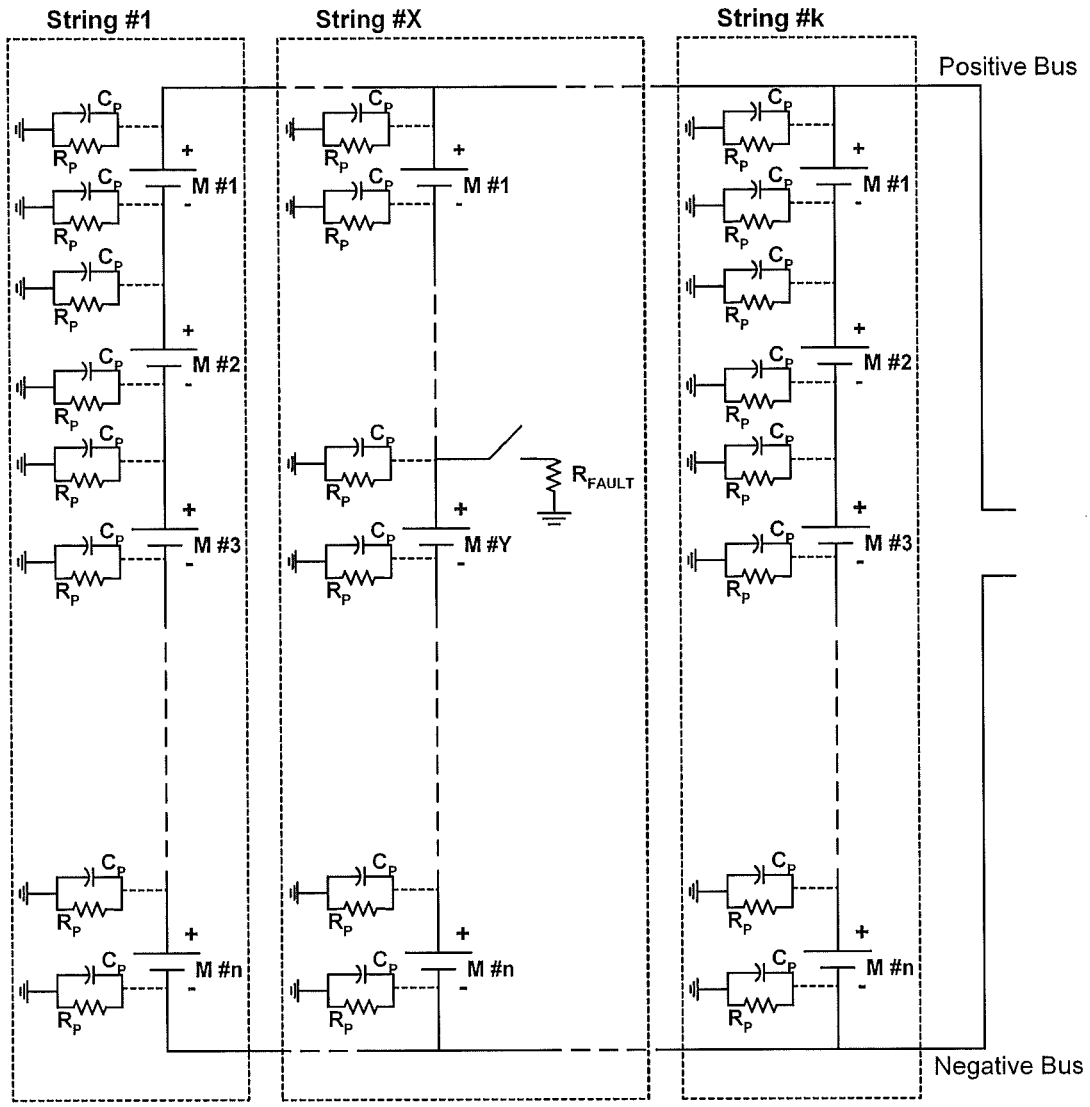
FIG. 8 is a schematic diagram illustrating a model of a photovoltaic array.

A simulation was performed to evaluate potential performance of fault detection techniques according to some embodiments of the inventive subject matter. The simulation utilized a model of a photovoltaic array as shown in FIG. 8, which illustrates a plurality of strings #1-#k of photovoltaic cells M#1-#n, coupled in parallel to positive and negative DC busses. Ground faults were simulated as connections of a resistance $R_{FAULT}$ at various points in the photovoltaic array. "Normal" leakage of the photovoltaic panels was modeled as connections to ground via resistors and capacitors RP, CP. The simulations assume that the photovoltaic array is connected to a DC bus that is modulated at a third harmonic (180 Hz) of the fundamental AC output frequency, as described in the UPS examples above.

Figure 9:
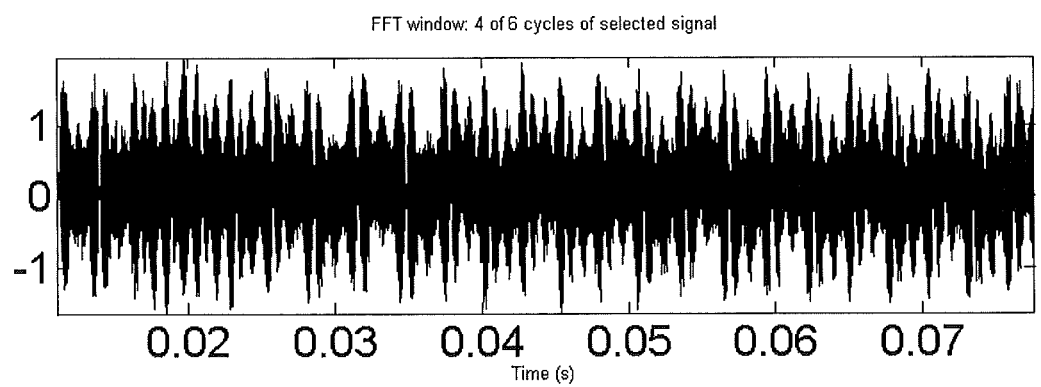
FIGS. 9-15 are graphs illustrating simulated residual current performance in a photovoltaic array under various fault conditions.
Figure 10:
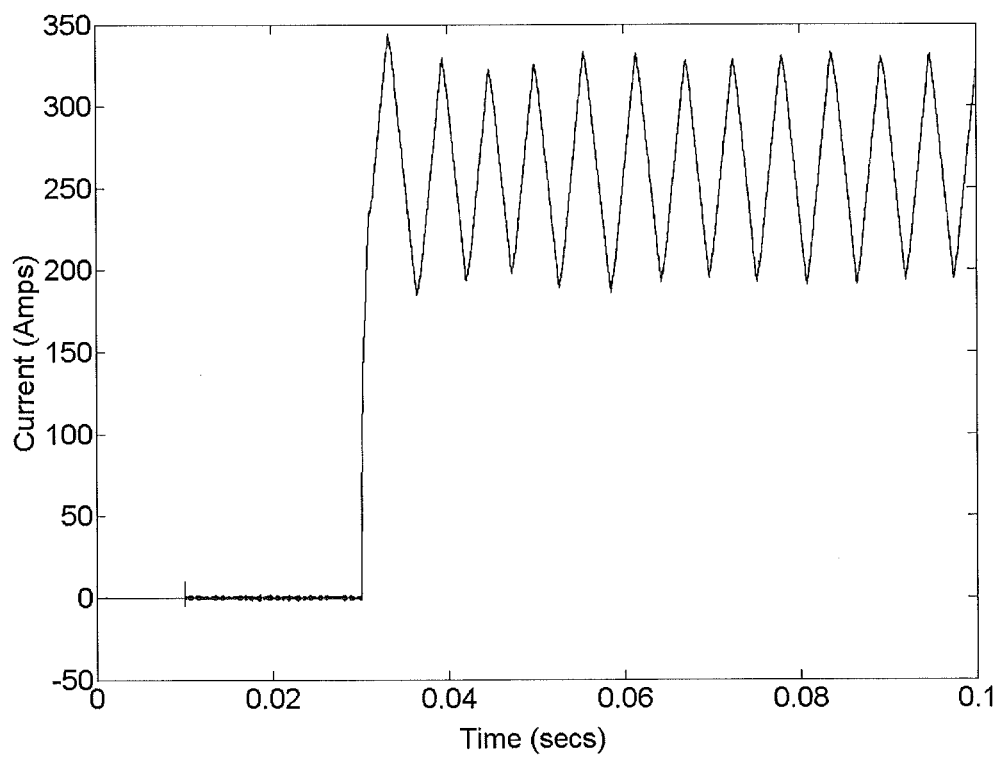
Figure 11:
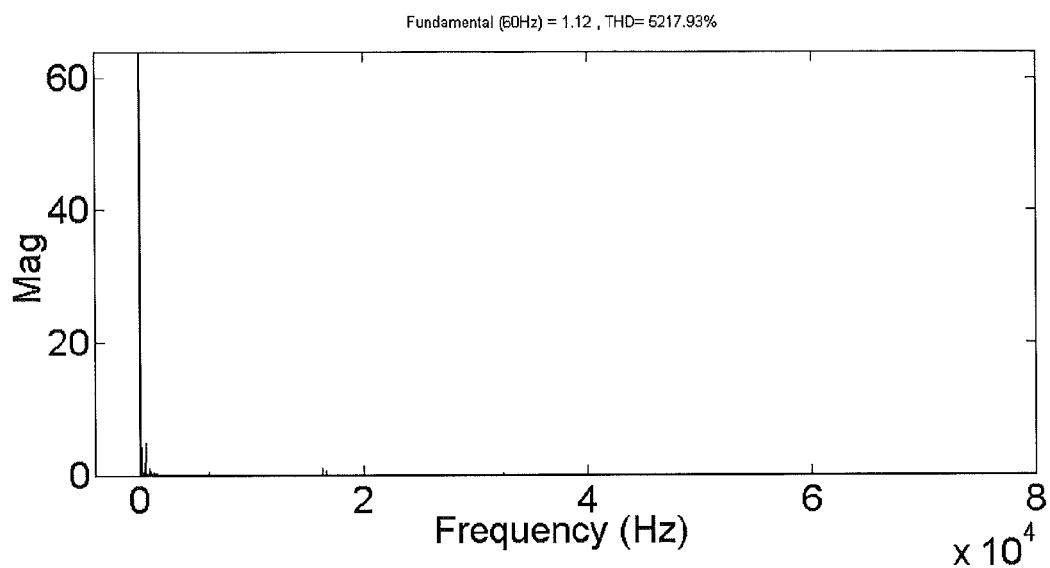

FIG. 9 illustrates simulated residual current of the photovoltaic array when no ground fault is present. FIG. 10 illustrates a simulated low impedance fault in one of the strings near one of the DC busses. As can be seen, the residual current increases dramatically. The frequency spectrum of the residual current is shown in FIG. 11, which illustrates that a DC component is dominant. These simulations suggest that such a low impedance fault may be detected by monitoring amplitude (e.g., the RMS (root mean squared) value or peak value) of the residual current of the photovoltaic array.

Figure 12:
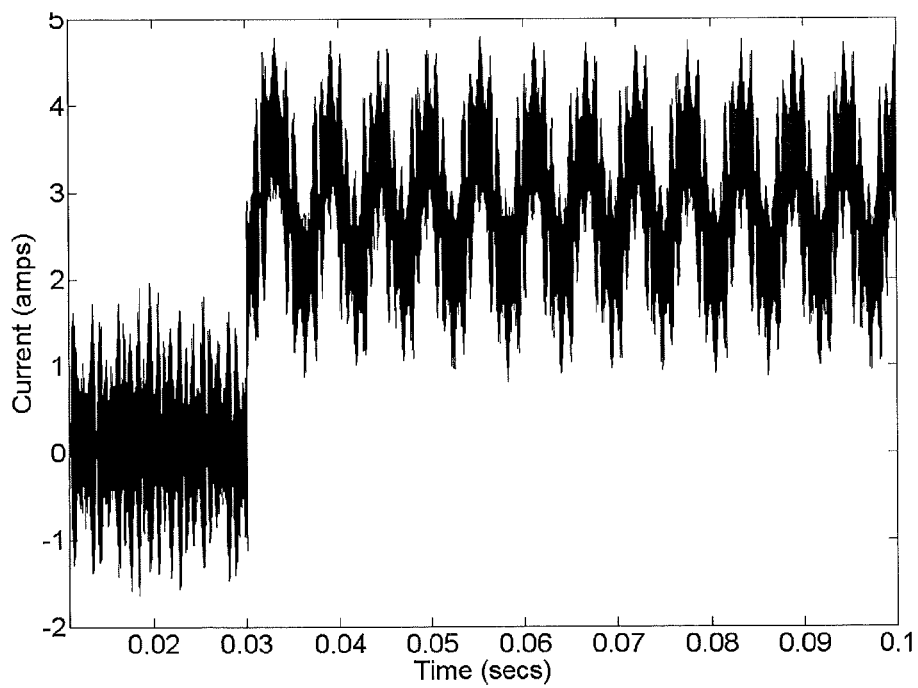
Figure 13:
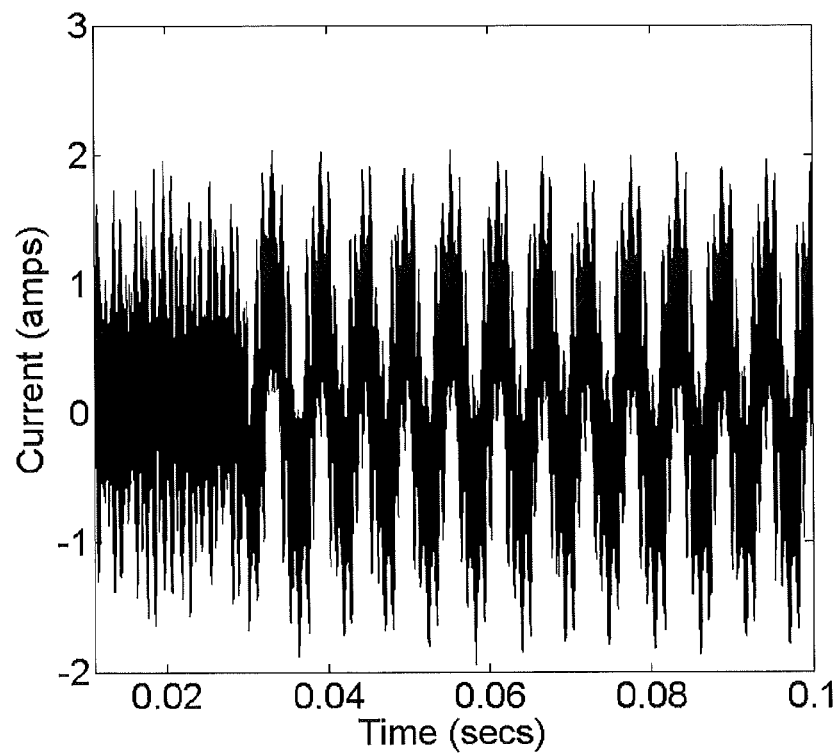

FIGS. 12 and 13 illustrate simulated residual current for a relatively high-impedance fault at locations near the end of a photovoltaic string and near the middle of the photovoltaic string, respectively. For the fault near the end of the string (FIG. 12), a change in residual current is detectable from the RMS or peak value of the residual current, suggesting that such a technique may be effective in detecting such a fault. However, for the fault near the middle of the string (FIG. 13), the RMS and peak values of the residual current may not significantly change, suggesting that it might be difficult to detect such a fault based solely on the RMS or peak value of the residual current.

Figure 14:
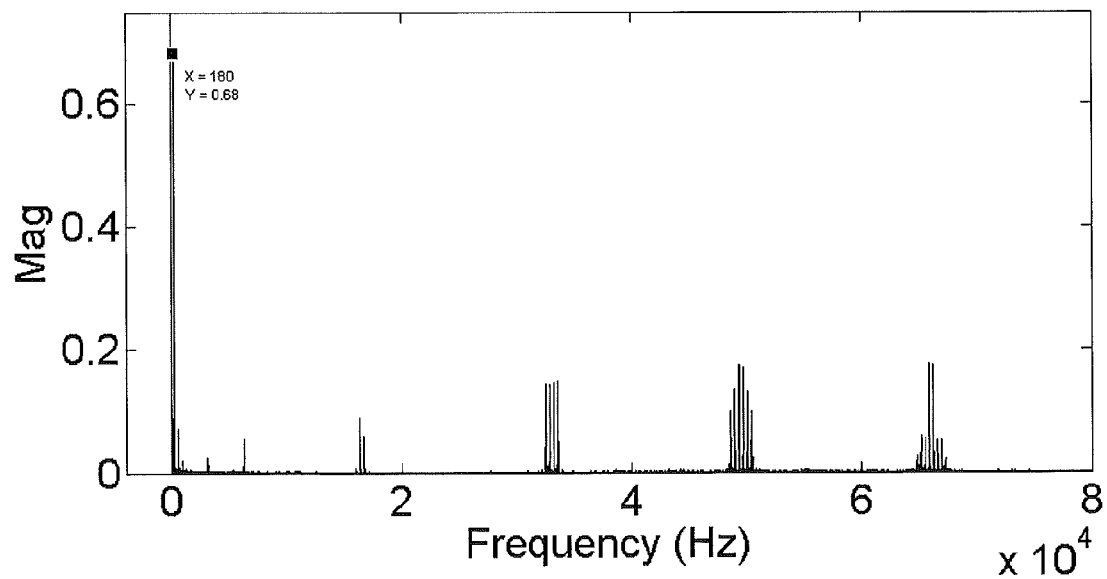
Figure 15:
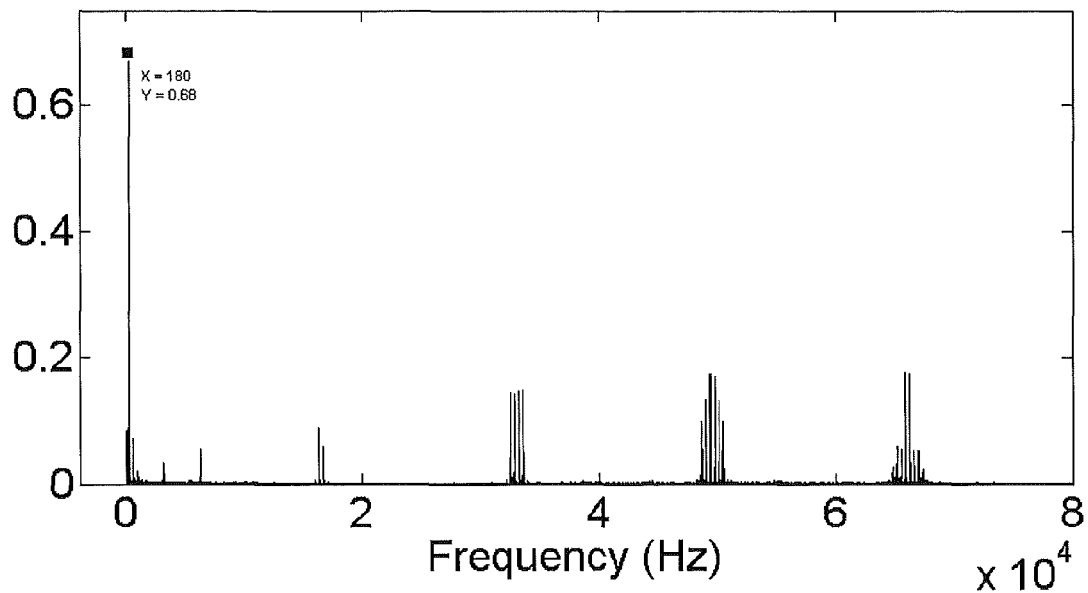

However, FIGS. 14 and 15, which illustrate the spectral content of the residual current for the fault conditions of FIGS. 12 and 13, respectively, indicate that a significant 180 Hz AC component is present in the residual current (the "0" frequency reference in the ordinate of FIG. 14 corresponds to 180 Hz) in both fault cases. This suggests that monitoring of an AC component of residual current can be used to discriminate such faults.

Figure 16:
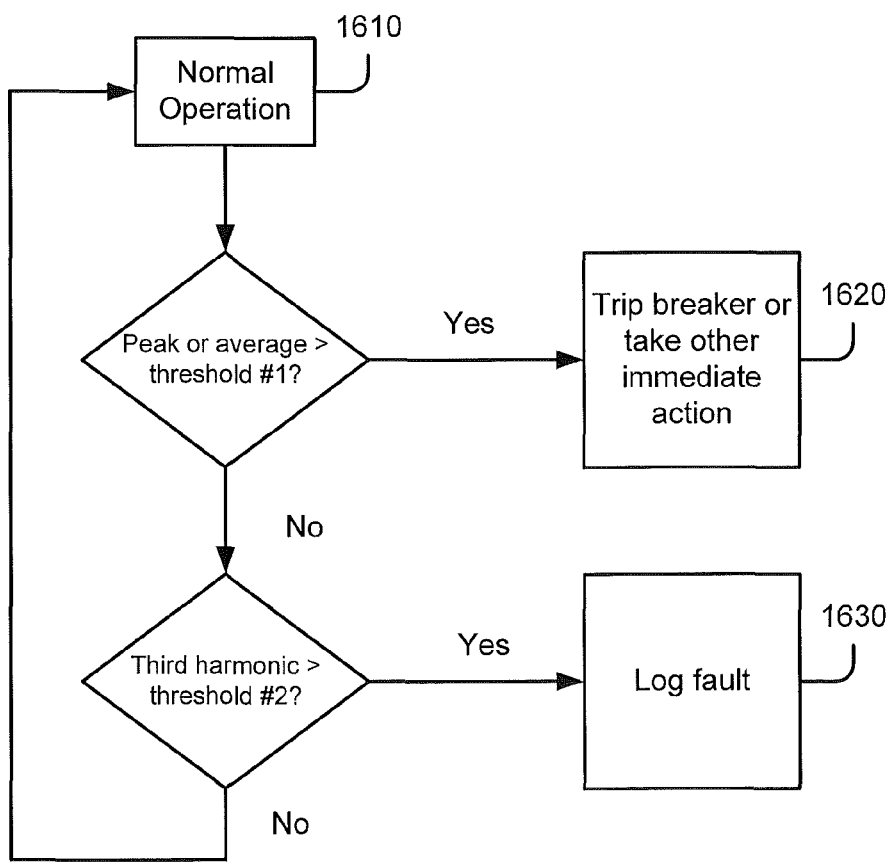
FIG. 16 is a flowchart illustrating fault identification operations according to some embodiments of the inventive subject matter.

This can enable more sophisticated system monitoring and control. For example, as illustrated in FIG. 16, a power system, such as a UPS system, that is interfaced to a DC source such as a battery or photovoltaic cell string may monitor residual current (block 1610). If the RMS or peak value of the residual current exceeds a first threshold indicative of a relatively low impedance fault, the system may trip a breaker or take other immediate action to protect equipment and/or personnel (block 1620). If the RMS or peak current is not above the threshold, the system may further determine whether an AC component (e.g., a third harmonic 180 Hz component along the lines described above) is greater than a second threshold indicative of a relatively high impedance fault. In response to detecting such a fault, the system may take less dramatic, but still valuable actions, such as logging the fault to identify it for future maintenance actions (block 1630) that prevent a more damaging fault in the future. The thresholds may be based, for example, on impedance measurements of the DC source, and may be adaptively modified. It will be further appreciated that it may be possible to further discriminate among faults using such component analyses such that, for example, the location of the fault may be estimated.

It will be appreciated that AC fault detection circuitry described above with reference to FIGS. 1-6 may implement operations along the lines described with reference to FIG. 16. For example, the fault detection circuitry may comprise digital or analog circuitry configured to decompose a residual current signal into frequency components and to analyze these components for various artifacts indicative of faults. This circuitry may also be configured to perform additional functions related to fault detection, such as data logging, alarm generation, activation of protection components (e.g., circuit breakers) and the like.

Figure 17:
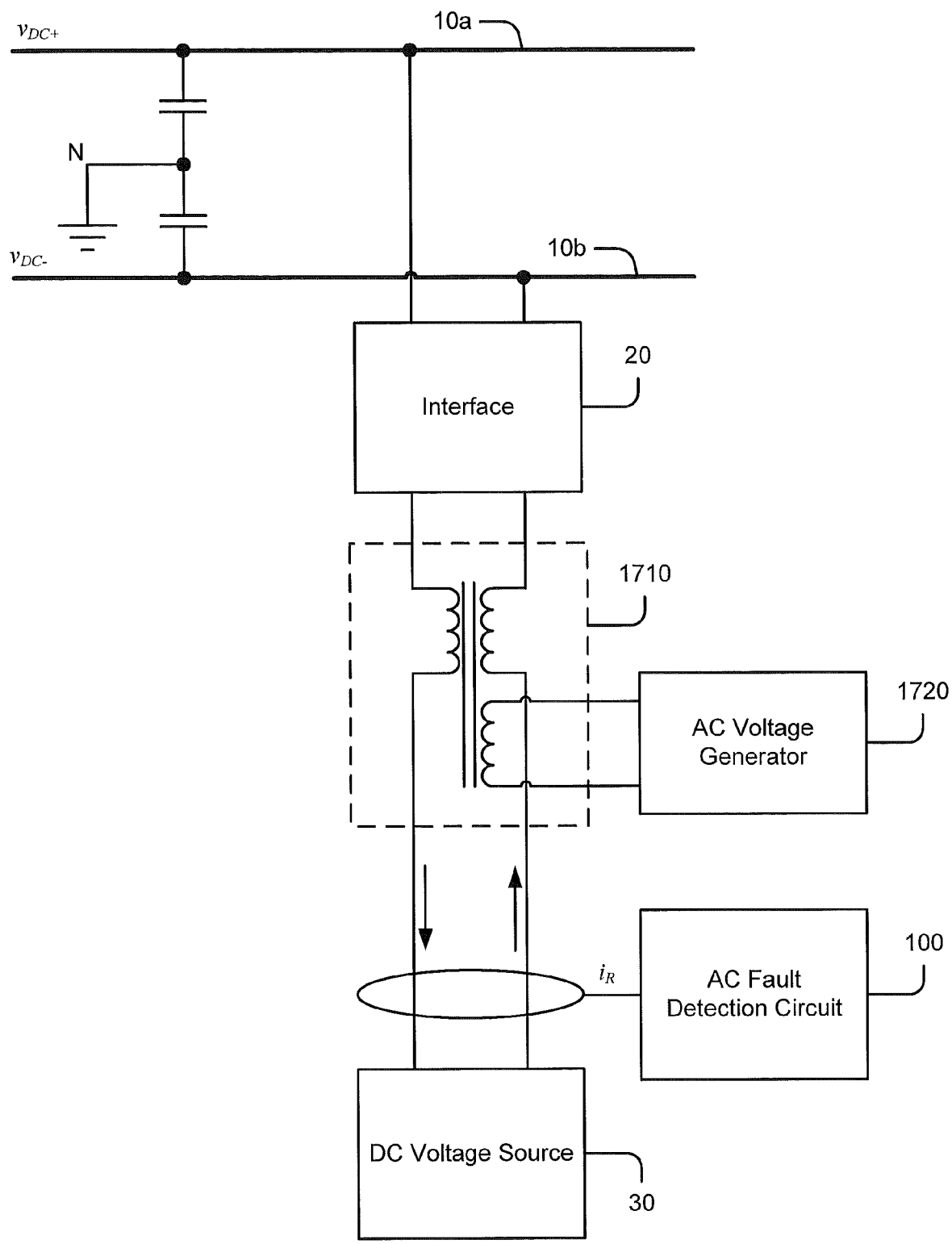
FIGS. 17 and 18 are schematic diagrams illustrating various techniques for AC excitation of a DC source according to some embodiments of the inventive subject matter.
Figure 18:
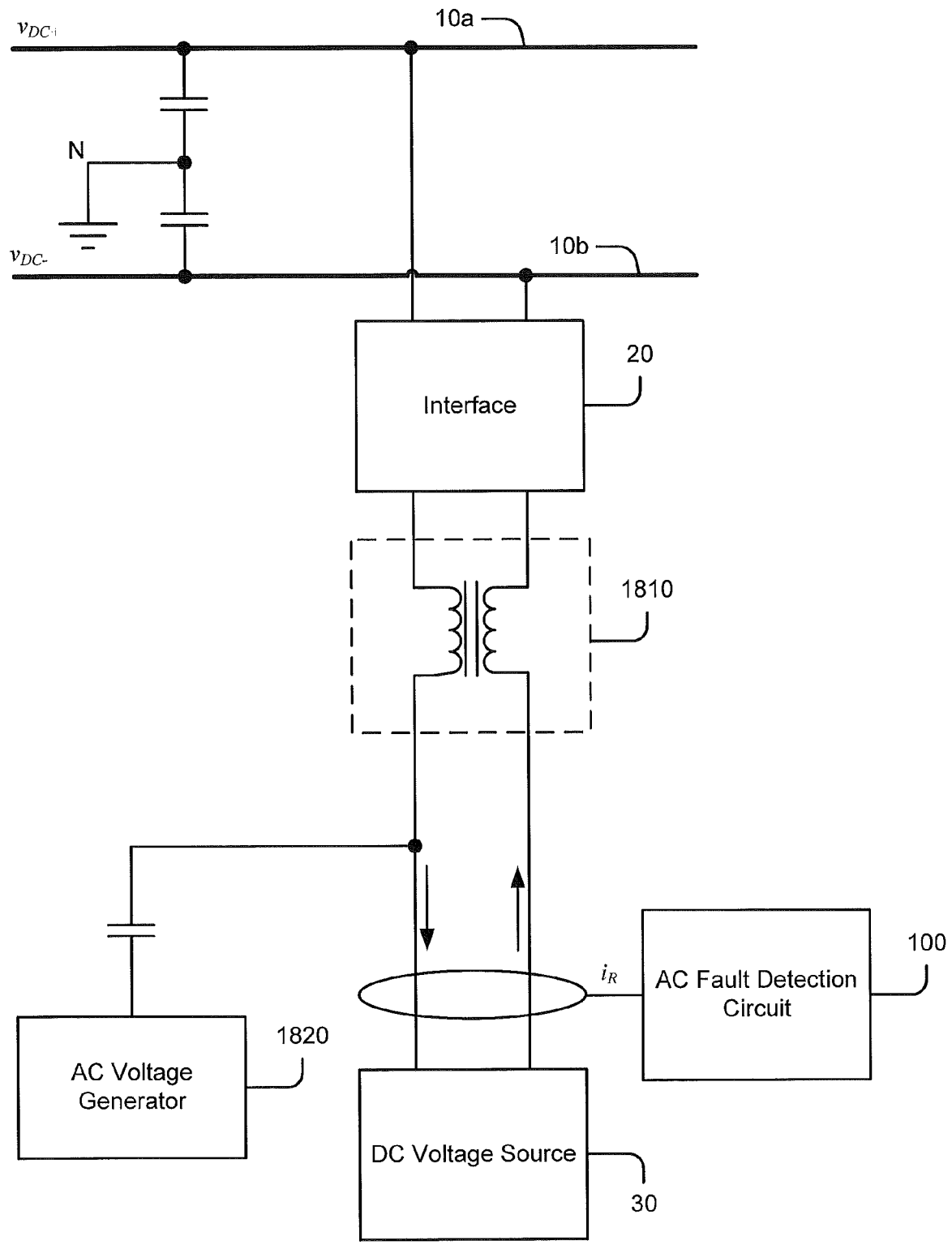

Although use of a neutral coupling function in a UPS system to provide AC excitation for fault detection purposes is described above, it will be appreciated that other techniques may be used to provide similar excitation. For example, FIG. 17 illustrates a modification of the configuration of FIG. 1 (like reference numerals refer to like components) wherein a DC power source 30 is connected to DC busses 10a, 10b via a common mode inductor assembly 1710. The common mode inductor assembly 1710 includes an auxiliary winding that is coupled to an AC voltage generator circuit 1720 that provides AC excitation of the busses of the DC power source 30. FIG. 18 illustrates another modification of the configuration of FIG. 1, wherein a DC power source 30 is connected to DC busses 10a, 10b via a common mode inductor assembly 1810 and AC excitation is provided by an AC voltage generator circuit 1820 capacitively coupled to the DC power source 30.

Figure 19:
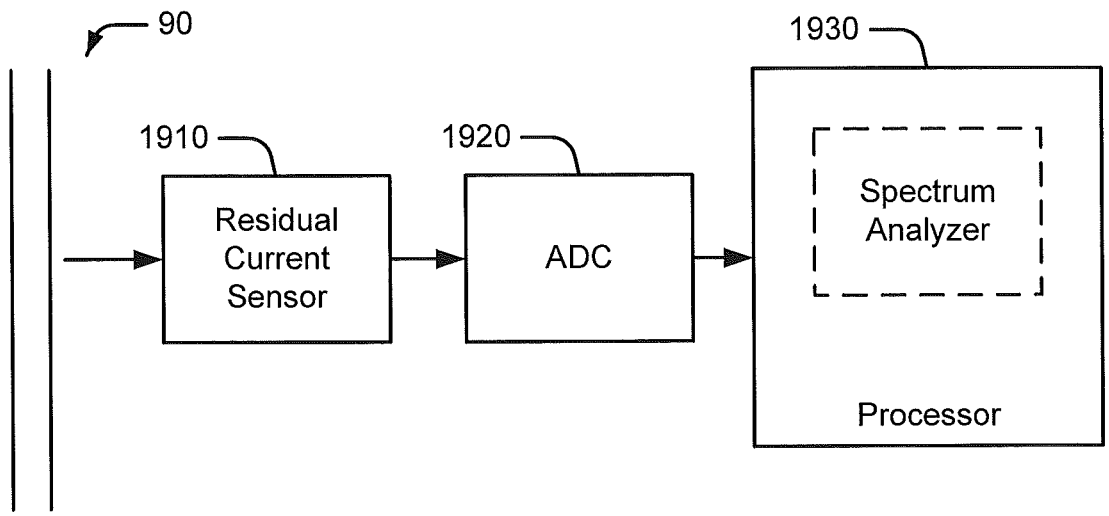
FIGS. 19 and 20 are schematic diagrams illustrating various techniques for detection and analysis of residual current of a DC source according to some embodiments of the inventive subject matter.

It will also be appreciated that any of a number of techniques may be used to detect components of residual current according to embodiments of the inventive subject matter. For example, residual current measurements may be resolved into frequency components using digital techniques. FIG. 19 illustrates an example wherein a residual current sensor 1910, e.g., a current transformer, Hall Effect sensor or the like, is used to sense residual current in conductors 90 of a DC power source. An analog to digital converter (ADC) 1920 converts the current sense signal to digital samples that are provided to a processor 1930, e.g., a microprocessor or microcontroller. The processor 1930 may be programmed to implement a spectrum analyzer 1932 that determines frequency components of the sensed residual current and, for example, analyzes these components to detect ground fault conditions as described above. The processor 1930 may also be programmed to perform other functions, such as communication of information regarding detected faults to a supervisory controller in a UPS or other system control component.

Figure 20:
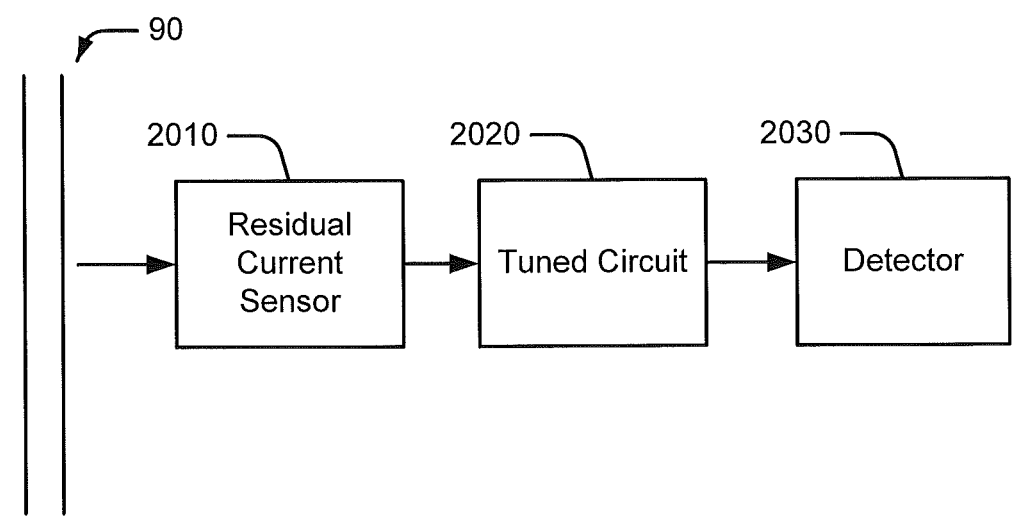

It will be appreciated that fault detection may use analog circuitry that performs similar functions. For example, as illustrated in FIG. 20, a residual current sensor 2010 may be coupled to a tuned circuit 2020 that is configured to receive a particular frequency component of the sensed residual current, e.g., an AC power frequency harmonic component, and a detector circuit 2030 (e.g., a comparator circuit or similar circuitry) that is configured to compare a magnitude or other measure of the received component to a particular threshold to detect fault conditions.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A method of monitoring a DC voltage source, the method comprising:
   selectively coupling a neutral to first and second DC busses that are coupled to the DC voltage source to generate a voltage having an AC component on the first and second DC busses;
   detecting a residual current associated with the generated voltage at a point between the DC voltage source and the first and second DC busses; and
   identifying a fault in the DC voltage source by detecting a change in an AC component of the detected residual current.

2. The method of claim 1, wherein the first, and second DC busses are components of an uninterruptible power supply (UPS) system comprising an inverter having an input coupled to the first and second DC busses.

3. The method of claim 1, wherein generating a voltage having an AC component on the first and second DC busses comprises shifting the first and second DC busses with respect to a neutral using the neutral coupling circuit.

4. The method of claim 2, wherein the inverter is configured to generate an AC output voltage and wherein the AC component of the detected residual current has a frequency that is a harmonic of a fundamental frequency of the AC output voltage.

5. The method of claim 4, wherein the frequency of the AC component of the detected residual current is a third harmonic of the fundamental frequency of the AC output voltage.

6. The method of claim 1, wherein the DC voltage source comprises a string of serially-connected voltage sources.

7. The method of claim 6, wherein the DC voltage source comprises a string of serially-connected electrochemical cells or a string of serially-connected photovoltaic cells.

8. A system for monitoring a DC voltage source, the system comprising:
   a neutral coupling circuit configured to selectively couple a neutral to first and second DC busses that are coupled to the DC voltage source to generate a voltage having an AC component on the first and second DC busses;
   a current sensor configured to detect a residual current of the DC voltage source at a point between the DC voltage source and the first and second DC busses; and
   a fault detection circuit coupled to the current sensor and configured to detect a change in an AC component of the detected residual current and to identify a fault in the DC voltage source responsive thereto.

9. The system of claim 8, wherein the first and second DC busses are components of an uninterruptible power supply (UPS) system.

10. The system of claim 9, wherein the UPS system comprises an inverter coupled to the at least one DC bus and configured to generate an AC output voltage and wherein the AC component of the detected residual current has a frequency that is a harmonic of a fundamental frequency of the AC output voltage.

11. The system of claim 10, wherein the frequency of the AC component of the detected residual current is a third harmonic of the fundamental frequency of the AC output voltage.

12. The system of claim 8, wherein the DC voltage source comprises a string of serially-connected voltage sources.

13. The system of claim 8, wherein the DC voltage source comprises a string of serially-connected electrochemical cells or a string of serially-connected photovoltaic cells.

14. An uninterruptible power supply (UPS) system, comprising:
- first and second DC busses;
- a neutral;
- an inverter having an input coupled to the first and second DC busses and configured to generate an AC output voltage therefrom;
- a DC voltage source coupled to the first and second DC busses;
- a neutral coupling circuit configured to selectively couple the first and second DC busses to the neutral to generate an AC voltage on the first and second DC busses;
- a current sensor configured to detect a residual current of the DC voltage source; and
- a fault detection circuit coupled to the current sensor and configured to detect a change in an AC component of the detected residual current associated with the AC voltage on the first and second DC busses and to identify a fault in the DC voltage source responsive to the detected change.

15. The system of claim 14, wherein the AC component of the detected residual current has a frequency that is a harmonic of a fundamental frequency of the AC output voltage.

16. The system of claim 15, wherein the frequency of the AC component of the detected residual current is a third harmonic of the fundamental frequency of the AC output voltage.

17. The system of claim 14, wherein the DC voltage source comprises a string of serially-connected voltage sources.

18. The system of claim 14, wherein the DC voltage source comprises a string of serially-connected electrochemical cells or a string of serially-connected photovoltaic cells.

19. The system of claim 14, wherein the fault detection circuit is configured to identify a first fault in the DC voltage source by detecting a change in an harmonic content of the residual current and to identify a second fault in the DC voltage source by detecting a change in an RMS or peak value of the detected residual current.

* * * * *